United States Patent [19]

Palmer

[11] Patent Number: 4,593,266

[45] Date of Patent: Jun. 3, 1986

[54] ANALOG-TO-DIGITAL CONVERTER/DEMODULATOR FOR FM SIGNALS

[75] Inventor: Richard C. Palmer, Blawenburg, N.J.

[73] Assignee: RCA Corporation, Princeton, N.J.

[21] Appl. No.: 521,453

[22] Filed: Aug. 8, 1983

[51] Int. Cl.[4] .................................................. H04L 27/14
[52] U.S. Cl. .............................. 340/347 AD; 328/112; 328/140; 329/106
[58] Field of Search ................ 340/347 AD; 328/112, 328/140, 141; 329/106, 126

[56] References Cited

U.S. PATENT DOCUMENTS

| | | | |
|---|---|---|---|
| 3,548,328 | 1/1969 | Breikss | 329/126 |
| 3,624,523 | 11/1971 | Katz | 328/141 |
| 3,670,250 | 6/1972 | Fritkin | 329/126 |
| 3,944,935 | 3/1976 | Plant | 328/140 |
| 4,061,976 | 12/1977 | Sugai | 329/106 |
| 4,313,103 | 1/1982 | Shull | 340/347 |

FOREIGN PATENT DOCUMENTS

| | | |
|---|---|---|
| 1187936 | 4/1970 | United Kingdom . |
| 1267026 | 3/1972 | United Kingdom . |
| 1525260 | 9/1978 | United Kingdom . |

OTHER PUBLICATIONS

J. Muramatsu et al. "6-Bit A-D Chip Steps Up the Page of Signal Processing", Electronic Design, 9/16/82, pp. 89-97.

Crochiere et al. "Interpolation and Decimation of Digital Signals—A Tutorial Review" Proc. IEEE, vol. 69, No. 3, 3/83, p. 300.

Primary Examiner—Clifford C. Shaw
Attorney, Agent, or Firm—E. M. Whitacre; P. J. Rasmussen; E. P. Herrmann

[57] ABSTRACT

An analog-to-digital converter/demodulator consists of n delay elements, each of which has a delay period longer than a preceding delay element by a fixed amount, and n pulse coincidence detectors. A ONE-SHOT responsive to the FM signal generates a pulse for each zero crossing of the FM signal, which pulses are applied to one input of each detector and to the input terminals of the n delay elements. The output terminals of the delay elements are coupled to respective second input terminals of the coincidence detectors. The output terminals of the coincidence detectors are applied to a DECODER which provides a binary output signal corresponding to the instantaneous frequency defined by the period between successive pulses i.e., between successive zero crossings.

11 Claims, 7 Drawing Figures

ANALOG-TO-DIGITAL CONVERTER/DEMODULATOR FOR FM SIGNALS

This application relates to apparatus for demodulation and analog-to-digital conversion of a phase frequency modulated waveform.

With the advent of high speed integrated digital circuitry it is becoming popular to convert analog signals to the digital domain for processing because of the inherent stability of digital circuitry with respect to component aging. Thus, the need for analog-to-digital converters (ADC), and there are many such devices available for converting the amplitude of time varying signals to a pulse code modulated (PCM) manifestation for subsequent digital or binary processing. However, if the analog signal is an FM waveform and a demodulated PCM signal is desired, it is inconvenient to first convert the analog FM signal to PCM signal and then demodulate the FM-PCM signal. Hence, the need for an integral FM-ADC demodulator circuit.

I.P. Breikss describes one such device in U.S. Pat. No. 3,548,328 entitled "Digital FM Discriminator". The Breikss apparatus limits the FM signal and utilizes its period to operatively control a counter. Pulses from a clock signal of uniform frequency are counted during each period of the FM signal and interpreted relative to a fixed number of counts, to determine, in normalized form a PCM signal representative of the information contained in the FM input signal. This type of FM discriminator nominally requires a clock signal having a frequency at least two orders of magnitude higher than the FM signal to be demodulated if reasonable resolution is to be attained. Two disadvantages are immediately apparent: (a) the creation of localized RFI and (b) the required processing speed of the counters etc. is increased to that of the clock rate. The present invention overcomes the limitations imposed by the high frequency clock.

SUMMARY OF THE INVENTION

The present invention is a flash type ADC for FM signals, which operates on the principle of comparing successive zero crossings of the FM waveform to fixed temporal references. The apparatus consists of $2^{n-1}$ delay elements having successively greater delay times, and $2^{n-1}$ comparators. The FM waveform is applied to a one-shot multivibrator that is triggered to produce a narrow output pulse of constant duration for both positive and negative zero crossings. The pulses from the one-shot are applied to the delay elements and to one input of each of the comparators. Delayed output signal from the delay elements are applied to second input connections of respective comparators. The incremental delays of the $2^{n-1}$ delay lines and the width of the one-shot output pulse are arranged so that each successive zero crossing produces an output in only one of the comparator circuits. The comparators are connected to a decoder e.g. a programmed logic array (PLA) which identifies the comparator outputting signal and produces an n-bit PCM codeword which corresponds to the frequency or period defined by the lastmost two zero crossings.

DETAILED DESCRIPTION

Figure 1:
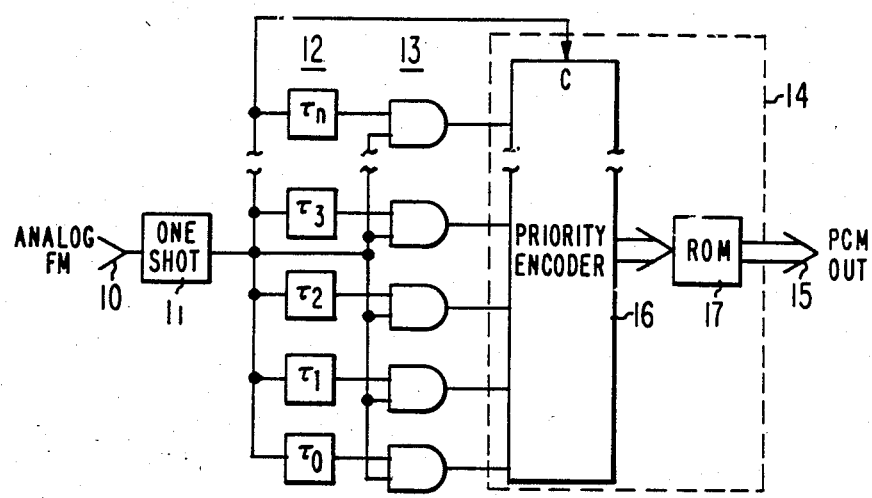
FIGS. 1, 4 5a and 5b are partial block-partial schematic diagrams of FM-to-digital converters embodying the present invention.

Consider the circuit consisting of a pulse generator and a two-input AND gate, with the output terminal of the pulse generator connected directly to the first input of the AND gate and through a delay element to the second input of the AND gate. Assume that the pulses provided by the generator have a constant width and are narrow compared to the period between pulses, and that the periods of the pulses are random. Each time a pair of successive pulses occur separated by a time period equal to the delay time of the delay element, the first pulse of the pair will be exiting the delay element coincident with the production of the second pulse. Thus, a pulse will be applied to both inputs of the AND gate causing it to produce an output pulse for the duration of coincidence. The output of the AND gate therefore provides an indication that the lastmost two pulses were separated by a period defined by the fixed delay of the delay element. The combination of delay element and AND gate is a detector for pulses of a defined period. Now consider a number, n, of delay element-AND gate combinations connected to the pulse generator with each delay element having an incrementally greater delay time.

If the number n is for example 256 then 256 or $2^8$ different pulse periods are detectable by the $2^8$ AND circuits. Finally if the $2^8$ outputs from the AND gates are applied to a decoder circuit an 8-bit PCM code can be generated, each successive output codeword therefrom representing the period between the lastmost two pulses. Finally consider that the pulse generator is a ONE-SHOT responsive to the zero crossings of an analog (e.g. limited) FM waveform. The output of the decoder will correspond to a binary manifestation of the instantaneous periods of the FM waveform.

Referring to the drawings, elements in the several drawings designated with the same numbers provide substantially identical functions.

In FIG. 1 an analog FM signal which may have been amplified and clipped is applied at connection 10 to the input of a monostable circuit depicted as ONE-SHOT 11. ONE-SHOT 11 generates a narrow pulse for each zero crossing of the FM waveform (or each transition of the clipped FM waveform). The pulses from ONE-SHOT 11 are applied to delay elements 12 and to one input of respective AND gates 13. The output connections from the delay elements 12 are connected to respective second input terminals of the AND gates 13 and the output terminals of the AND gates are coupled to respective input connections of the DECODER 14. The output pulses from ONE-SHOT 11 may also be applied to a latching input $C_L$ of the DECODER. (Note it may be desirable to provide output latches in the DECODER to maintain the PCM output stable between zero crossings).

Nominally there is a minimum duration, $\tau_{min} = \tau_0$, between zero crossings of the FM waveform. This period defines the delay period of the first delay element designated $\tau_0$. The next larger delay element $\tau_1$ has a delay of $\tau_0+\tau$ where $\tau$ is an incremental delay generally significantly smaller than $\tau_0$ and which defines the resolution of the apparatus. Each succeeding delay element includes an additional incremental delay of $\tau$ with the nth delay element $\tau_n$ providing a delay of $\tau_0+n\tau$ equal to the maximum interval $\tau_{max}$ between zero crossings of the FM waveforms.

An alternative arrangement for the delay elements consists of arranging a delay element with delay $\tau_0$ in series with the ONE-SHOT output so that the parallel delay elements 12 need only provide the incremental delays $R\tau$ where R corresponds to the Rth delay element.

The width of the pulses generated by the ONE-SHOT are designed according to the particular design of the DECODER apparatus. In general however the pulse duration must be at least equal to one half the incremental delay, $\tau$, or pulses may be missed by the AND gate detectors.

Particular detection signals from AND gate 13 which are input to the DECODER is related to the number, R, of incremental delays determined to exist between zero crossings and therefor related to time. The actual period between zero crossings is $\tau_0+R\tau$. The minimum delay $\tau_0$ can also be represented by some number, S, of incremental delays so that the period between zero crossings is $(S+R)\tau$. The modulating signal of an FM waveform however is related to the instantaneous frequency of the FM signal. Therefore it is the reciprocal of $(S+R)$ that is related to the demodulated FM signal. If the output signal provided by the DECODER is to represent the demodulated signal, the DECODER must output signals associated with reciprocal values of $(S+R)$ for the Rth AND gate producing a detection signal. The reciprocals of $(S+R)$ are the demodulated signal scaled by a factor $1/\tau$ and offset by an amount related to $\frac{1}{2}$ the differences between $\tau_{max}-\tau_{min}$.

The DECODER required to generate the reciprocals of $(S+R)$ may be a device of the type known as a programmed logic array (PLA). Alternatively the DECODER 14 may include a priority encoder 16 and a ROM 17. The priority encoder generates an n bit PCM output code for $2^n$ input connections and in the instant application produces the binary representation R. The PCM output of the priority encoder is thereafter coupled to the ADDRESS inputs of the memory device 17 which is programmed to provide at its output, a binary manifestation corresponding to the reciprocal of the sum of the ADDRESS code and the value S. In addition, the memory may be nonlinearly programmed to compensate for signal or certain system nonlinearities.

Figure 2:
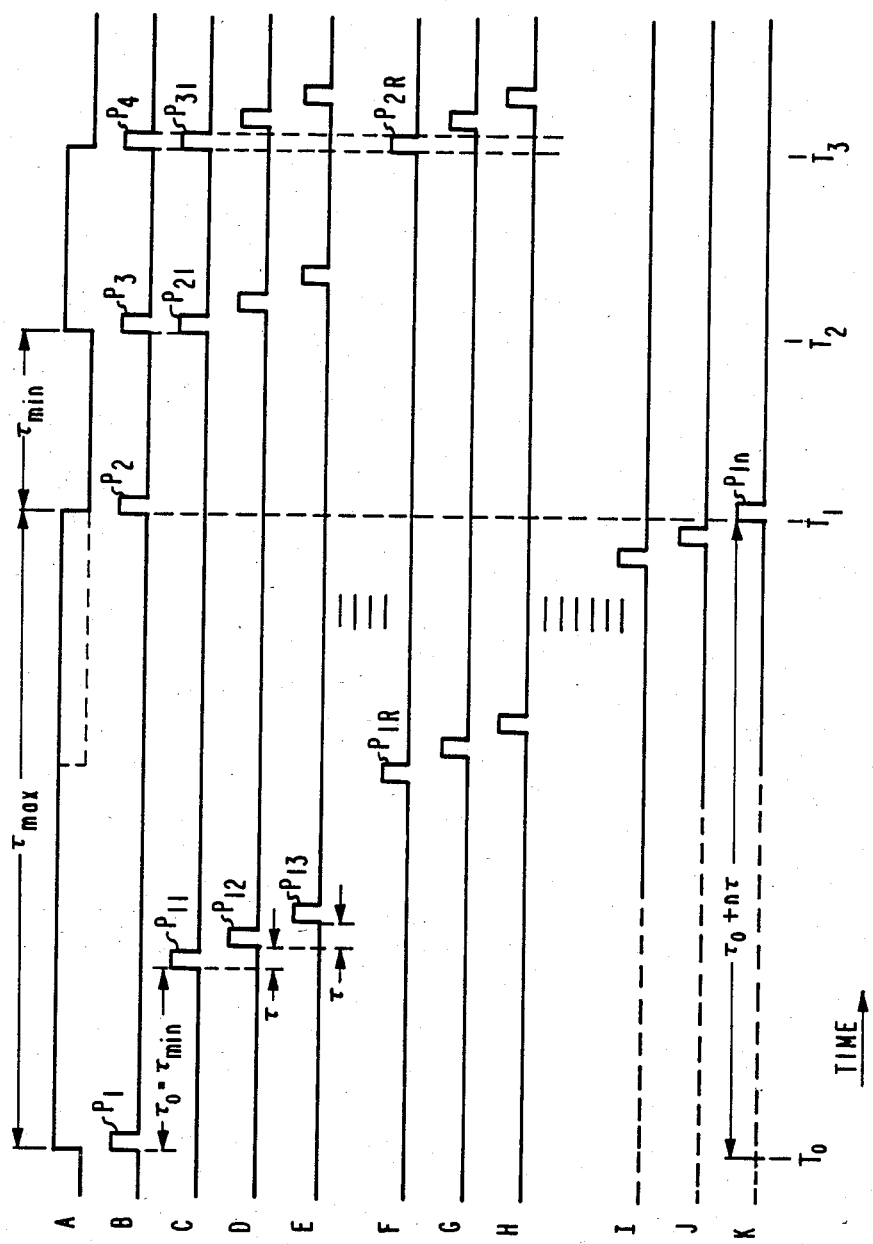
FIGS. 2 and 3 are waveform diagrams showing the temporal response of different points in the FIG. 1 embodiment.

Operation of the apparatus will be further described with reference to FIGS. 2 and 3. In FIG. 2 waveform A corresponds to a limited or clipped FM waveform in which level transitions correspond to zero crossings. For convenience a maximum period $\tau_{max}$ and a minimum period $\tau_{min}$ between zero crossings are shown adjacent one another though in practice such a condition is unlikely to occur due to bandwidth limitations.

The signal of waveform A is applied to ONE-SHOT 11 which is responsive to the transitions thereof and produces pulses of constant duration indicated in waveform B. The signal of waveform B is applied to each of the delay elements 12. Waveforms C,D,E correspond to the output signals from delay elements $\tau_0,\tau_1,\tau_2$ respectively. It can be seen that each delay element delays the applied signals by successively greater periods. Waveform K corresponds to the output of delay element $\tau_n$ and provides a signal delay of $\tau_0+n\tau$. The transition at time $T_0$ produces pulse $P_1$ which is applied to the delay elements and exits therefrom as pulses $P_{1R}'$ as shown. At time $T_1 = T_{max} = \tau_0+n\tau$ the pulse $P_1$ exits delay element $\tau_n$ (waveform K). At time $T_1$ a second transition of waveform A occurs generating the next pulse $P_2$ (waveform B). Pulse $P_2$ and $P_{1n}'$ from delay element $\tau_n$ appear concurrently and would cause the AND gate coupled to delay element $\tau_n$ to change output state and register a detection. Note that the pulses $P_{1R}'$ illustrated by waveforms C,D,E,F,G,H,I and J would have previously passed out of their respective delay elements while waveform B, which is coupled to one input of each of the AND gates, was low preventing the AND gates coupled to these delay elements from producing detection signals.

The DECODER responsive to the signal from the $\tau_n$ AND gate would output a signal related to the number n. If the pulse $P_2$ occurred prior to time $T_1$, as shown dotted in FIG. 2, it would have been in coincidence with a delayed pulse from an intermediate delay element e.g. pulse $P_{1R}'$ in waveform F etc.

Pulse $P_2$ applied to the respective delay elements exits as pulse $P_{2R}'$ from the respective delay elements. A further transistion $\tau_{min}=\tau_0$ seconds later produces pulse $P_3$. Pulse $P_3$ occurs simultaneously with pulse $P_{21}'$ exiting delay element $\tau_0$. The AND gate coupled to delay element $\tau_0$ will detect the coincidence and DECODER 14 will output a binary value related to the minimum delay period i.e. zero incremental delays. Note that when pulse $P_3$ occurs the pulses $P_2$ coursing through all succeeding delay stages will not yet have become available at their respective outputs. Note also that if three zero crossings occur in close proximity generating three successive pulses ($P_2$, $P_3$, $P_4$), it is possible that two pulses ($P_2$, $P_3$) may simultaneously exit separate delay stages currently with the occurrence of the third pulse ($P_4$). In this instance there will be double detection ($P_4$-$P_{31}'$) and ($P_4$-$P_{2R}'$) the latter producing an erroneous result. Avoidance of this problem will be described below with reference to the FIG. 4 circuit.

In an alternative arrangement, double detection can be used to advantage. By suitably proportioning the ONE-SHOT pulse width vis a vis the period $\tau$, adjacent detection circuits may simultaneously be enabled. Consider the pulses to be rectangular and of width $3\tau/4$. Pulses from successive delay elements will be separated by $\tau/4$. A later pulse from the ONE-SHOT may therefore straddle delayed pulses from adjacent delay elements. The $R^{th}$ detection gate will only be uniquely enabled for the later pulse having a leading edge occurring over the incremental range of (0 to $\tau/4$). For the leading edge of the later pulse occurring between the range $-\tau/4$ and $\tau/2$ relative to the $R^{th}$ delay, both the $R^{th}$ and the $(R-1)^{th}$ detection gates will be enabled. And for the leading edge of the later pulse occurring over the range of $\tau/4$ and $3\tau/4$, relative to the $R^{th}$ delay, both the $R^{th}$ and the $(R+1)^{th}$ detection gates will be enabled. By appropriate design of the decoder to interpret simultaneous occurrences of detection signals from adjacent detection elements the resolution of the n gate system can be enhanced to the resolution of a $(2n-1)$ delay element system.

Figure 3:
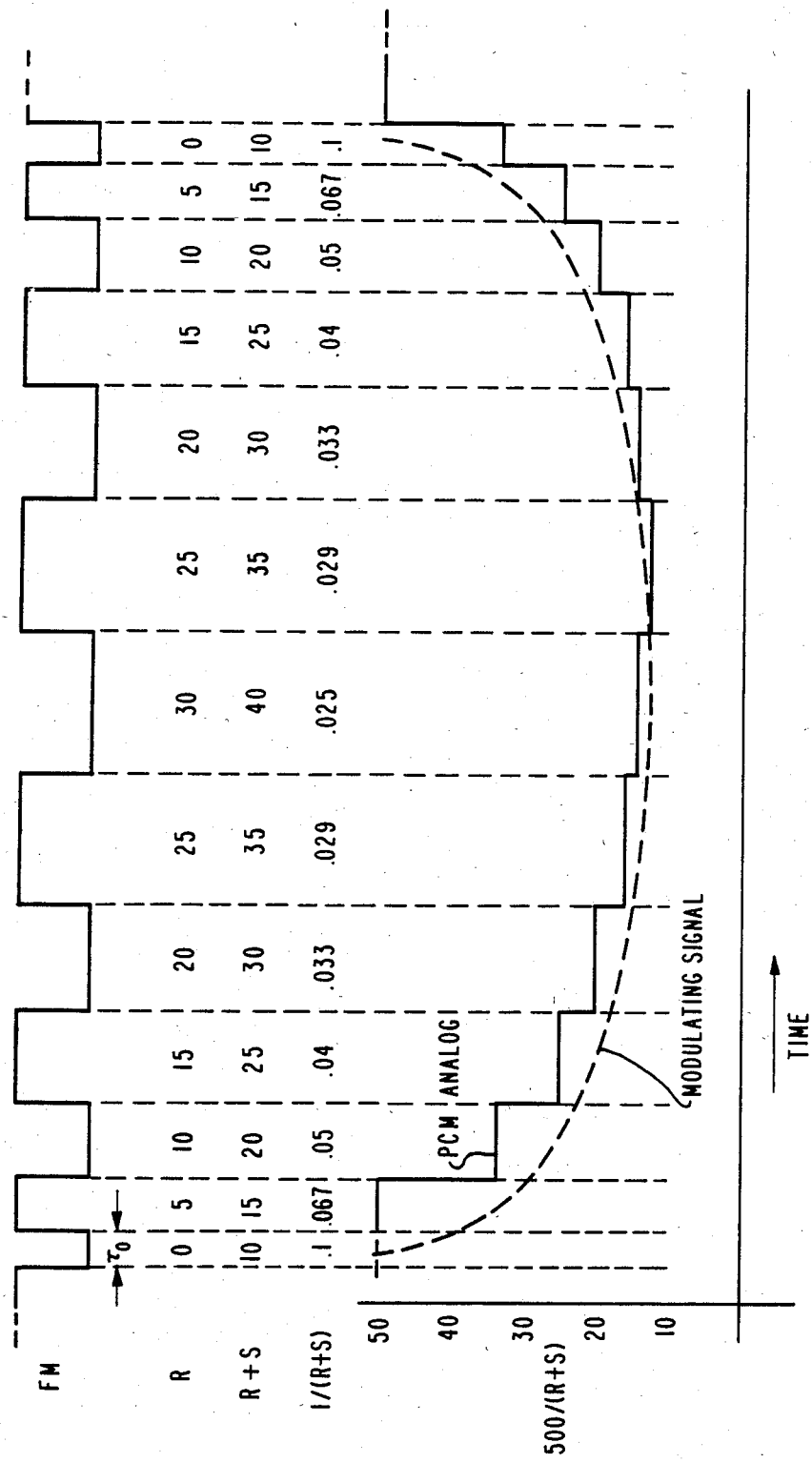

Refer next to FIG. 3. The upper waveform designated FM is an arbitrary FM waveform in which the period between zero crossings linearly increases and then decreases. The first period designated $\tau_0$ is presumed to be a minimum period. The period $\tau_0$ was chosen to be equal to ten incremental delays i.e. $\tau_0 = 10\tau$, and the periods between zero crossings are increased by increments of $5\tau$. The modulating signal for an FM signal with symmetrical linearly increasing and decreasing periods is hyperbolic and proportional to $1/\tau$. This signal is illustrated by the dashed line designated modulating signal.

The incremental increase between zero crossings are listed in units of $\tau$ in the row of numbers designated R. Immediately below row R is the sum of the units, R, of the incremental delays and the units, $S = 10$, of fixed delay contributed by $\tau_0$. The reciprocal of the sums (R+S) are listed in the row of numbers designated $1/(R+S)$. These values, multiplied by the arbitrary constant of 500, are then shown graphically by the waveform marked PCM ANALOG, and represent the output of the DECODER scaled by 500 for the waveform, FM, applied to the converter. It is seen that the modulating signal closely approximates the envelope of the sampled data PCM ANALOG signal. The PCM ANALOG signal is skewed slightly to the right because the values corresponding to a particular period are produced during the succeeding period. In addition there is a slight frequency distortion because the duration of a particular sample value is determined by the succeeding period. This latter distortion can be reduced by sampling the PCM output data at a constant rate and interpolating or "averaging" each value over several values.

Figure 4:
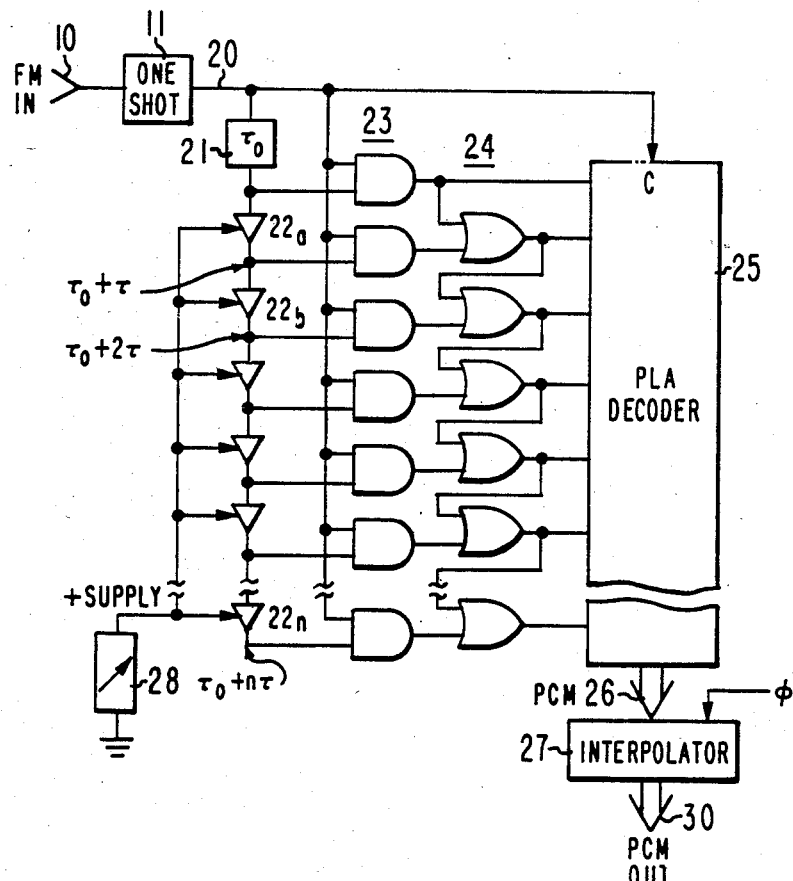

FIG. 4 is a variation of the FIG. 1 converter which includes specific apparatus for creating the incremental delays. The FM waveform to be converted is applied at connection 10 to ONE-SHOT pulse generator 11. The output of the ONE-SHOT at connection 20 is applied to delay element 21, AND gate 23 and DECODER 25. Delay element 21 provides a delay $\tau_0$ equivalent to the minimum period between zero crossings of the FM signal. The output of element 21 is coupled to the input of a logic gate 22a which may be for example a simple buffer or an OR gate, or an AND gate with its input tied together etc., having a defined delay period between its input and its output connections (traditionally known as its propagation or gate delay). Similar gates 22b to 22n are cascade connected with gate 22a each of which has similar gate delay periods. The gate delay of the elements 22a, 22b ... etc. in this arrangement is the incremental delay $\tau$ which determines the resolution of the converter. Because of the cascade arrangements of gates 22 each successive gate adds an additional delay to the pulses applied to delay element 21. The delay periods at the output connections of element 21, gates 22a, 22b and 22n are respectively $\tau_0$, $\tau_0 + \tau$, $\tau_0 + 2\tau$ and $\tau_0 + n\tau$.

Propagation or gate delays are related to the technology utilized in fabricating the devices. For example bipolar emitter-coupled devices may have gate delays of less than a nanosecond. In CMOS technology gate delays of 10 ns (high speed technology) and 30ns (standard technology) are typical. In both cases the speeds can be varied by changing the supply potentials to the circuitry or varying internal or external capacitances associated with the gates affording some programmability or adaptive control to the circuit resolution. In FIG. 4 the programmability of the gate delays is indicated by the variable gate supply source 28. When integrated on a single silicon die uniformity of delays from gate-to-gate can be maintained within a few percent.

Referring again to FIG. 4 respective OR gates are interposed between the pulse coincidence detection AND gates 23 and the decoder 25. The OR gates are included to prevent false readings where the total incremental delays produced by gates 22 is greater than the minimum time between zero crossings. If the total incremental delay is greater than the mimimum zero crossing interval, $\tau_{min}$, it is possible for two successive pulses, produced by zero crossings defining a period close to $\tau_{min}$, to be concurrently traversing the delay stages 22. On the occurrence of the next pulse, the two pulses present in the delay stages will cause two of the AND gates 23 to concurrently produce detection signals. However, since the lastmost pulse introduced into the delay stages produces the correct detection signal, means are provided to override the detection signal produced by the earlier introduced pulse which remained in the delay stages. One method to accomplish the override is to cause all of the input signals to DECODER 25 representing delays equal to and greater than the delay of the AND gate located closest the ONE-SHOT to detect coincidence, to also produce detection signals. In other words, the DECODER input signals from all detection circuits preceeding the first circuit which registers pulse coincidence will be held at a logic low level and DECODER input signals from all succeeding detection circuits will be forced to a logic high level. In FIG. 2 each DECODER input signal is ORed with the succeeding detection signal. The detection signal of the uppermost AND gate (in the FIGURE) to register coincidence will thus be ORed into all succeeding DECODER inputs. DECODER 25 will be designed to output PCM samples which correspond to the first (in position, not time) DECODER input signal registering a logic high. Note however that the condition of two pulses simultaneously traversing the delay elements cannot occur if the minimum period between zero crossings is greater than one half the maximum period between zero crossings of the FM signal. When these conditions exist it is not necessary to include the override circuitry in the converter.

In FIG. 4 the PCM output 26 of DECODER 25 is connected to an interpolator 27 which is clocked at a fixed rate by a clock signal $\phi$ which rate may be greater than the frequency of the FM carrier. Interpolator 27 weights and combines a number of samples, e.g. four, produced by the DECODER, and provides "averaged" samples, at the fixed rate, at its output 30. The interpolation may be linear, cubic or some other polynominal function. (For detailed information on interpolation the reader is referred to R. E. Crochiere et al., "Interpolation and Decimation of Digital Signals—A Tutorial Review", Proc. IEEE, Vol. 69, No. 3, March 1981, incorporated herein by reference). The interpolator provides fixed rate samples for subsequent synchronous processing and tends to smooth the envelope defined by the DECODER output samples and linearize the output response.

FIG. 5 is a further embodiment of the invention wherein the incremental delays are generated by a resistor ladder network with capacitors connected to respective tap points 41, 42. The delay per section is determined by the RC time constant. Note that if capacitors C are of the voltage variable type the incremental delay times can be adjusted by changing the DC bias, $V_{bias}$, imposed across the capacitors. The RC network is terminated in its characteristic impedance 43 to preclude reflections.

A delay element 40 having a delay $\tau_0$ is connected between ONE-SHOT 11 and the RC network and may consist of a number of similar cascaded connected RC networks. Alternatively delay element 40 may consist of a fixed delay multivibrator and second ONE-SHOT or of a voltage variable resistance-capacitance circuit as shown in FIG. 5b. Here the channel resistance of a field effect transistor (FET), 49, which resistance is dependent upon the bias potentials between its gate, source and drain electrodes, is used as the voltage variable resistor. Resistance changes are effected by adjustment of the gate potential of the FET. The voltage variable resistance provides for a variable delay $\tau_0$ which permits tuning of the converter-demodulator for different carriers or modulation conditions.

Figure 5A:
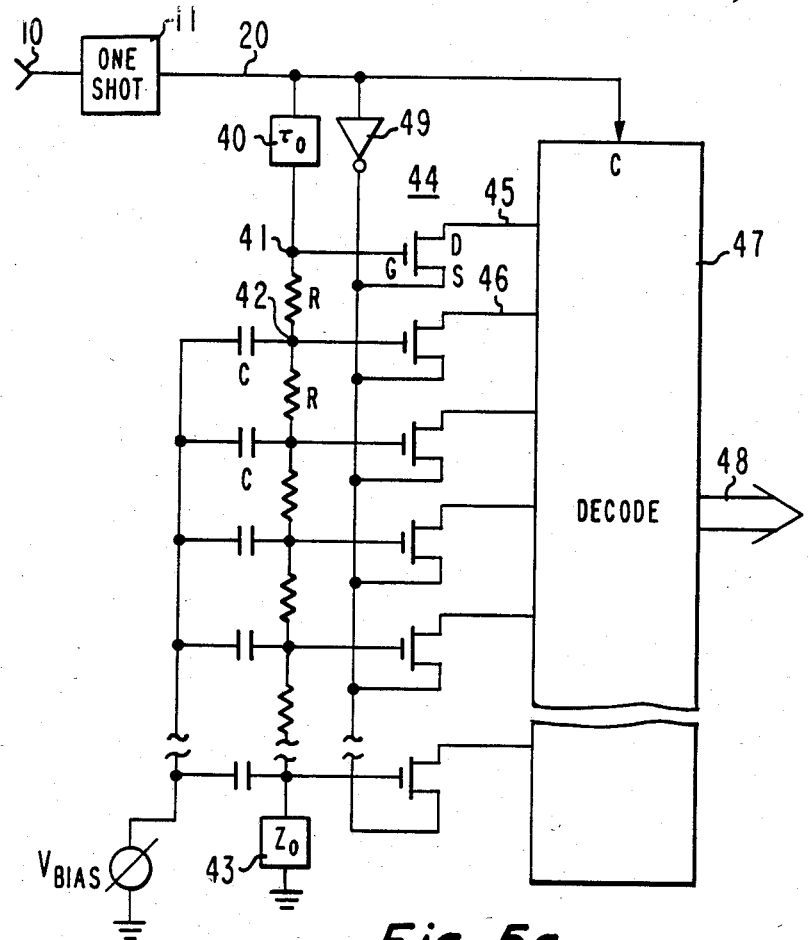
Figure 5B:
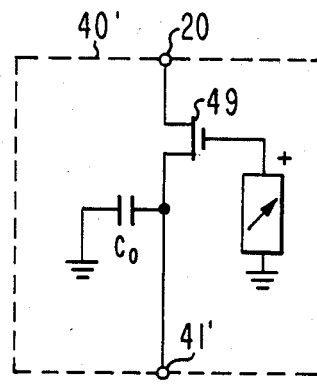

The pulse coincidence detectors in FIG. 5a are single FET's 44 having their gate electrodes connected to respective taps on the RC delay network and their source electrodes coupled in common to the ONE-SHOT 11 via an INVERTER 49. The drain electrodes of the FET's are connected to the DECODER 47 input terminals and the DECODER 47 is designed to respond to input current detection signals in this instance.

Assume that the FET's are N-type enhancement devices which are conditioned to conduct drain-source current responsive to a positive gate-to-source potential. When the ONE-SHOT output potential is low, i.e., during the interval between pulses, the INVERTER 49 output potential is high. This high potential applied to the source electrodes of FET's 44 creates a negative gate-to-source potential on each transistor and prevents them from conducting drain current. On the occurrence of the next pulse the output of the inverter goes low and the preceding pulse emerges from one of the delay elements providing a positive gate-to-source potential on the respective transistor which in turn provides a detection current signal to the DECODER 47. Note that if the source electrodes of the FET's 44 were coupled to the DECODER input connections and the ONE-SHOT coupled to the drain electrodes of the FET's, the INVERTER 49 is unnecessary. In this arrangement the FET's have a drain bias for conduction of drain current only when a pulse is provided by the ONE-SHOT. Thus only an FET having a gate pulse provided from its respective delay element coincidently with a pulse being generated by the ONE-SHOT will conduct and provide a detection signal to the DECODER.

Figure 6:
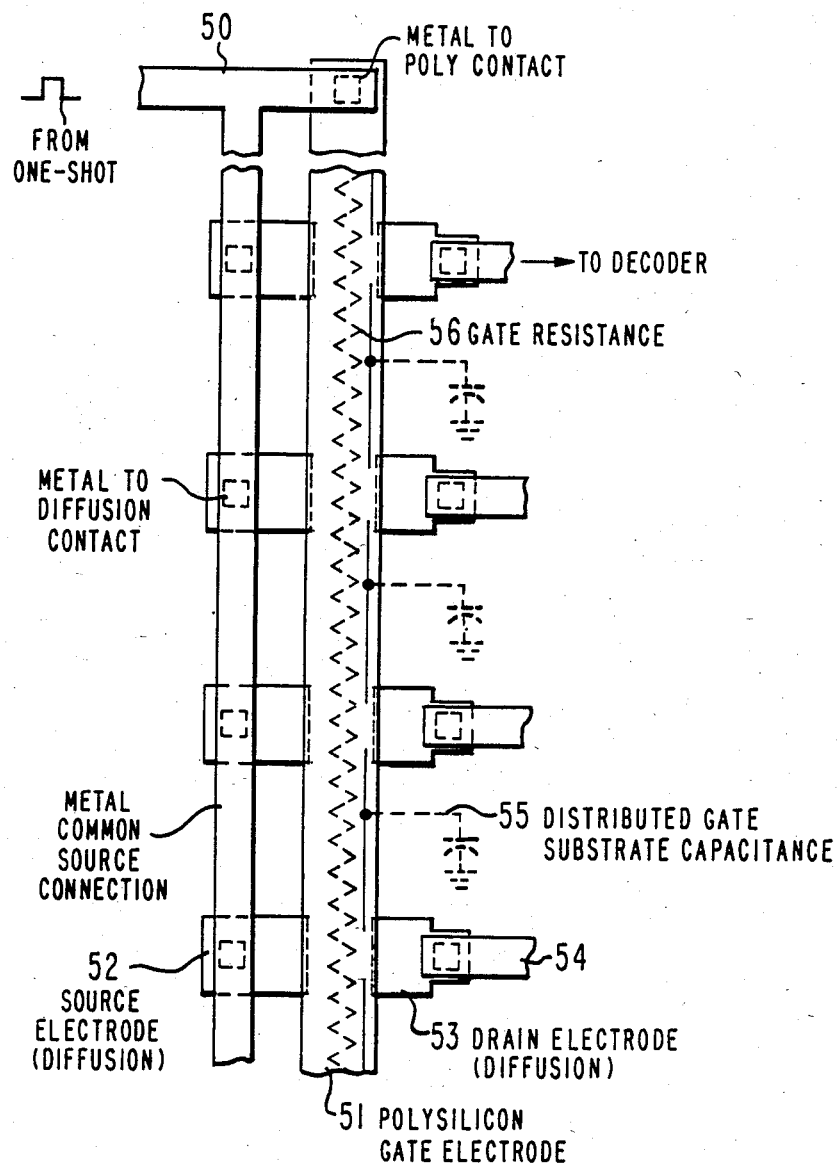
FIG. 6 is a detailed drawing of a portion of the FIG. 5 converter realized in integrated circuit form.

FIG. 6 is a pictorial representation of the FIG. 5 RC network and detection FET's as they may be realized in integrated circuit form. In FIG. 6 the resistors R are formed from a continuous polysilicon electrode 51 fabricated over a dielectric on a semiconductor die. The polysilicon (or other appropriate refractory electrode) is lightly doped so that it is rendered only slightly conductive, i.e., it is highly resistive. The electrode 51 has an inherent distributed capacitance 55 over its length associated with the dielectric and semiconductor die on which it is fabricated. The resistance 56 over its length can be made uniform as can the distributed capacitance, thus over a unit length they can be assumed to be lumped elements of cascade connected series resistors with shunting capacitors between the cascade connections. Drain 53 and source 52 diffusions are disposed in the silicon die adjacent the polysilicon electrode 51 such that it performs as a gate electrode for respective FET's. A number of pairs of source and drain diffusions are shown along the polysilicon electrode each forming an FET therewith. The resistance of the delay elements are determined by the spacing of FET's along the gate (polysilicon 51) electrode. The capacitance is determined primarily by the thickness of the dielectric and the width-length aspect ratio of electrode 51.

The respective source diffusions are coupled to the ONE-SHOT via a low impedance conductor 50 which also contacts one end of the polysilicon electrode 51. The respective drain diffusions are connected to the DECODER by respective low impedance conductors 54.

A further approach to realizing the incremental delays is to use the surface acoustic wave (SAW) phenomena with the signal tapped from the transport medium at appropriate locations, and applied to signal coincidence detection circuitry. This may be done in silicon as well as the more conventional SAW materials. However, if the surface acoustic wave phenomena of silicon is employed the detection and DECODER circuitry may be integrated on the same semiconductor substrate.

What is claimed is:

1. A digital converter of phase/frequency modulated analog signals comprising:
    means responsive to zero crossings of said analog FM signals for generating pulses of uniform pulse-width, which pulses are narrow relative to the period between said zero crossings;
    delay means responsive to said pulses for providing n delayed replicas of said pulses, which replicas are delayed by ascending delay periods, the periods increased by predetermined increments;
    a plurality of pulse coincidence detection means coupled to said means for generating pulses and responsive to said pulses and respective delayed replicas, for generating detection signals on the simultaneous occurrence of said pulses from the pulse generating means and a delayed replica of said pulses; and
    a DECODER responsive to detection signals from said coincidence detection means for providing digital manifestations corresponding to the periods between successive pulses.

2. The converter set forth in claim 1 wherein the digital manifestation corresponding to the period between pulses corresponds to the instantaneous phase/frequency of the analog signal defined by successive zero crossings.

3. The converter set forth in claim 2 wherein the delay means for providing delayed replicas of said pulses comprises n delay elements having respective input connections connected in parallel for applying said pulses thereto, having respective output connections at which said delayed replicas are available, a first of said delay elements having a delay period $\tau_0$, a second of said delay elements having a delay period $\tau_0+\tau$, and each Rth delay element having a delay period $\tau_0+(R-1)\tau$ where R is an integer and $\tau$ represents the predetermined delay increment.

4. The converter set forth in claim 2 wherein the means for generating pulses includes a ONE-SHOT, responsive to said zero crossings, for generating a pulse for each zero crossing of the analog signal.

5. The converter set forth in claim 1 wherein the DECODER comprises a programmable logic array responsive to said detection signals and programmed to output a digital signal corresponding to the instantaneous phase/frequency defined by the period between zero crossings indicated by respective detection signals.

6. The converter set forth in claim 1 wherein the DECODER comprises:
   a priority encoder responsive to said detection signals for generating a binary number representing the coincidence detection means providing a particular detection signal; and
   a memory element having an ADDRESS input coupled to said priority encoder and programmed to provide at an output bus, a value corresponding to the instantaneous phase/frequency of the analog signal for respective periods between zero crossings indicated by said detection signals.

7. The converter set forth in claim 1 wherein the delay means for providing delayed replicas includes (n−1) similar delay elements connected in cascade, the firstmost of which is coupled to the means for generating pulses.

8. The converter set forth in claim 7 wherein said similar delay elements are respective logic gates and the incremental delay period is the propagation delay of the respective gates.

9. The converter set forth in claim 7 wherein the delay period of said similar delay elements is adjustable.

10. The converter set forth in claim 1 further including an interpolator responsive to a sampling signal of fixed frequency for sampling said digital manifestation provided by said DECODER to provide samples corresponding to weighted sums of said digital manifestations.

11. The converter set forth in claim 1 wherein the pulse coincidence detectors are AND gates.

* * * * *